United States Patent [19]

Nomura et al.

[11] Patent Number: 4,721,547
[45] Date of Patent: Jan. 26, 1988

[54] PROCESS FOR PRODUCING SINGLE CRYSTAL OF GARNET FERRITE

[75] Inventors: Shunji Nomura, Yokohama; Senji Shimamuki, Atsugi; Susumu Hashimoto, Tokyo; Tomohisa Yamashita, Yamato, all of Japan

[73] Assignee: Kabushiki Kaisha Toshiba, Japan

[21] Appl. No.: 877,522

[22] Filed: Jun. 23, 1986

[30] Foreign Application Priority Data

Jun. 28, 1985 [JP]  Japan ............................... 60-140165
Sep. 27, 1985 [JP]  Japan ............................... 60-212605
Feb. 17, 1986 [JP]  Japan ............................... 61-30953

[51] Int. Cl.$^4$ .................................................. C30B 1/10
[52] U.S. Cl. ........................... 156/603; 156/DIG. 63; 156/DIG. 74
[58] Field of Search .................. 156/603, 608, 616 R, 156/616 A, 617 R, 617 SP, 620, 621, 624, DIG. 74, DIG. 89, DIG. 88, DIG. 63; 252/62.57

[56] References Cited

U.S. PATENT DOCUMENTS

| | | | |
|---|---|---|---|
| 2,957,827 | 10/1960 | Nielsen | 156/624 |
| 3,085,980 | 4/1963 | Gorter et al. | 252/62.57 |
| 3,414,372 | 12/1968 | Paulus et al. | 156/617 |
| 3,444,084 | 5/1969 | Geller et al. | 252/62.57 |
| 4,256,531 | 3/1981 | Kimura et al. | 156/620 |
| 4,444,615 | 4/1984 | Matsuzawa et al. | 156/603 |

FOREIGN PATENT DOCUMENTS 0026411  2/1982  Japan ............................... 252/62.57

OTHER PUBLICATIONS

Grayson, M., *Encyclopedia of Semiconductor Technology*, Wiley & Sons, 1984, pp. 212-225, 254.
IEEE Transactions on Magnetics, vol. MAG-7, pp. 773-776, "Substituted Polycrystalline YIG With Very Low Ferrimagnetic Resonance . . . ", Sep. 1971.

*Primary Examiner*—John Doll
*Assistant Examiner*—R. Bruce Breneman
*Attorney, Agent, or Firm*—Schwartz Jeffery Schwaab Mack Blumenthal & Evans

[57] ABSTRACT

A process for producing a signal crystal of garnet ferrite comprises causing a signal crystal to grow by subjecting raw materials for the garnet ferrite to sintering so as to utilize the anomalous grain growth induced by the sintering. The process requires a shorter period of time for the growth of the single crystal, is free from mixing of impurities, and is capable of producing a single crystal with a high Faraday rotation while reducing production cost for the crystal.

13 Claims, 10 Drawing Figures

PROCESS FOR PRODUCING SINGLE CRYSTAL OF GARNET FERRITE

BACKGROUND OF THE INVENTION

This invention relates to a process for producing a single crystal of garnet ferrites, and more specifically to a process for producing a single crystal of garnet ferrite suitable for use as a Faraday rotation material in an optical isolator adapted to prevent light from returning to a semiconductor laser employed for optical communication or in an optical magnetic field sensor adapted to control or protect electric power system in transformer substations.

As techniques for producing a single crystal of garnet ferrite useful as magnetooptical materials, the flux technique and LPE technique have been usually employed to date.

Of these techniques, the flux technique comprises melting raw materials for such respective components that form a ferrite having the garnet structure together with a flux component such as $PbO$, $PbF_2$ and/or $B_2O_3$ in a crucible, for example, made of platinum into a homogeneous melt and cooling the melt gradually to cause a single crystal of the garnet ferrite to grow.

Further, the LPE technique also comprises similarly to the flux technique, melting raw materials for such respective components that form a ferrite having the garnet structure into a homogeneous melt as described above and dipping a substrate having the garnet structure in the resulting melt while maintaining it at a temperature slightly lower than the saturation temperature to cause a single crystal of the garnet ferrite to grow on the substrate as a thin film.

However, the flux technique is accompanied by such problems that it requires long time, i.e., from a week to a month, for the growth of a single crystal and it cannot avoid the inclusion of impurities from the flux and crucible used.

On the other hand, the LPE technique requires shorter time for the growth of each crystal. However, in this technique, a larger single crystal having a three-dimensional structure cannot be obtained and mixing of impurities is also unavoidable because a flux and a crusible have to be used similarly to in the former technique.

Among these impurities, mixing of impurity ions other than trivalent ions, especially, $Pb^{2+}$, $Pt^{4+}$ and the like in a single crystal of garnet ferrite leads to a modification to the ionic valence of ferric ions (trivalent ions), thereby adversely affecting primarily the light absorption characteristic of the single crystal.

In addition, the above-employed crucible is usually made of a noble metal such as platinum. In order to cause a large single crystal to grow, it is indispensable to enlarge the crucible, resulting in a problem that the production cost jumps up.

Moreover, although it has been known that the degree of Faraday rotation $\theta_F$(deg/cm) of the garnet ferrite can be remarkably increased by substituting the c-site component in the garnet structure partially with $Bi^{3+}$, and increase in Faraday rotation is useful for miniaturing an element, it has been difficult to prepare single crystals of the garnet ferrite having such a large Faraday rotation.

SUMMARY OF THE INVENTION

An object of this invention is to solve the above-described problems and to provide a process for producing a single crystal of garnet ferrite, which process requires a shorter period of time for the growth of the single crystal, is free from mixing of impurities, is capable of producing a single crystal with a high Faraday rotation and can reduce its production cost.

In order to solve the above described problems and attain the objects of this invention, the present inventors have made an extensive investigation and as a result, they have found that a good single crystal of garnet ferrite can be obtained by applying certain specific sintering conditions which will be described hereinafter, especially, the sintering temperature described below, and have developed the process of the present invention.

More specifically, the process for producing a single crystal of garnet ferrite of this invention comprises causing a single crystal to grow by subjecting raw materials for the garnet ferrite to sintering in a temperature range in which grain growth, particularly anomalous grain growth is induced. The term anomalous grain growth is used here to denote that phenomenon by which not all crystal grains grow equally, relative to each other, but only a few crystal grains grow anomalously into grains that are very much larger than surrounding crystal grains.

BRIEF DESCRIPTION OF THE DRAWINGS

FIG. 5 further shows the average grain size and the relative density of a sintered body obtained at different sintering temperatures as a function of the sintering temperature, in a dotted line and a chain line, respectively;

FIG. 7 further shows the average grain size and the relative density of a sintered body obtained at different sintering temperatures as a function of the sintering temperature, in a dotted line and a chain line, respectively;

DESCRIPTIONS OF PREFERRED EMBODIMENTS

Figure 1:
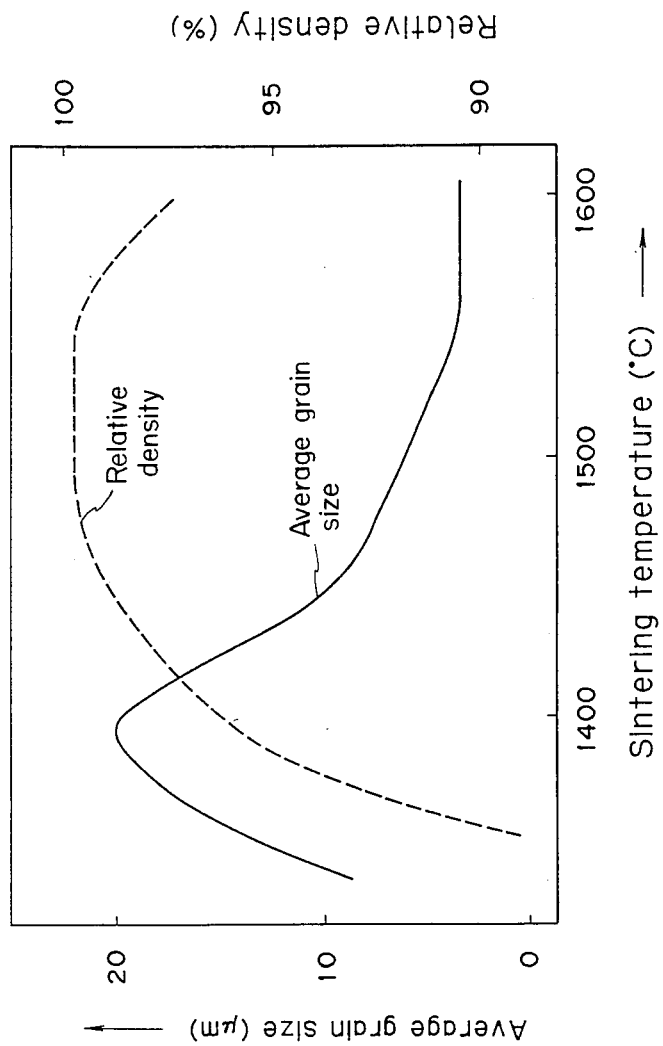
FIG. 1 shows the average grain size and the relative density of a sintered body having a composition of $Y_{2.5}Ca_{0.5}Fe_{4.5}Ge_{0.5}O_{12}$ in Example 14 as a function of the sintering temperature.

Garnet ferrites are generally represented by the following formula:

$$M_3Fe_5O_{12}$$

wherein M means yttrium (Y) or a rare earth element. In the above formula, M is usually called "the c-site component" in a ferrite having the garnet structure. Moreover, as sites in the five iron atoms, there are two types of sites, which are called "a-site" (the number of the a-site: 2) and "d-site" (the number of the d-site: 3), respectively.

In the process of this invention, the components of the above-mentioned respective sites are preferably constituted of one or more certain specific elements which will be described hereinafter.

Namely, when the composition of the the single crystal of the garnet ferrite obtainable by this invention is represented by Formula I:

$$R_{3-x}Ca_xFe_{5-x}M^1{}_xO_{12} \qquad \text{I}$$

wherein R is at least one element selected from the group consisting of yttrium (Y), gadolinium (Gd), terbium (Tb) and ytterbium (Yb) and $M^1$ is at least one element selected from the group consisting of germanium (Ge), silicon (Si), zirconium (Zr), titanium (Ti) and tin (Sn), and x represents the molar ratio index of calcium (Ca) and also the molar ratio index of the substituent element $M^1$ or is represented by Formula II:

$$R_{3-2y}Ca_{2y}Fe_{5-y}M^2{}_yO_{12} \qquad \text{II}$$

wherein R is at least one element selected from the group consisting of Y, Gd, Tb and Yb and $M^2$ is at least one element selected from the group consisting of vanadium (V) and antimony (Sb), y is ½ of the molar ratio index of Ca and also the molar ratio index of the substituent element $M^2$; the c-site component is constituted of R and Ca. Namely, at the c-site, the above-mentioned Y and/or a rare earth element represented by R have in part been substituted by $Ca^{2+}$. This Ca component serves to improve the sinterability.

The a-site component and d-site component correspond to the substituent element, $M^1$ in the above Formula I and the substituent element $M^2$ in the above Formula II. The substituent element $M^1$ or $M^2$ is incorporated to substitute the Fe sites so as to maintain electrical neutrality in relation to the $Ca^{2+}$ ions present at the c-site. When the amount of the a-site component substituted and the amount of d-site component substituted increase, the a-site component and the c-site component may be replaced with each other.

Further, when the composition of the single crystal of the garnet ferrite obtainable by this invention is, for example, represented by Formula III:

$$R_{3-k}Ca_kFe_{5-l}M^3{}_lO_{12} \qquad \text{III}$$

wherein R is at least one element selected from the group consisting of Y, Gd, Tb and Yb and $M^3$ is at least one element selected from the group consisting of Sn, Zr, Ti, Ge, Si, V and Sb, and k represents the molar ratio index of Ca and l represents the molar ratio index of the substituent element $M^3$; or is represented by Formula IV:

$$R_{3-m}Ca_mFe_{5-(m+n)}M^4{}_mM^5{}_nO_{12} \qquad \text{IV}$$

wherein R is at least one element selected from the group consisting of Y, Gd, Tb and Yb and $M^4$ is at least one element selected from the group consisting of Ge, Si, Sn, Zr and Ti, $M^5$ is at least one element selected from the group consisting of aluminium (Al), gallium (Ga) indium (In) and scandium (Sc), m represents the molar ratio index of Ca and also the molar ratio index of the substituent element $M^4$ and n represents the molar ratio index of the substituent element $M^5$; or is represented by Formula V:

$$R_{3-p}Ca_pFe_{5-(q+r)}M^6{}_qM^7{}_rO_{12} \qquad \text{V}$$

wherein R is at least one element selected from the group consisting of Y, Gd, Tb and Yb and $M^6$ is at least one element selected from the group consisting of Sn, Zr, Ti, Ge, Si, V and Sb, $M^7$ is at least one element selected from the group consisting of Al, Ga, In and Sc, p represents the molar ratio index of Ca, q represents the molar ratio index of the substituent element $M^6$ and r represents the molar ratio index of the substituent element $M^7$; or is represented by Formula VI:

$$R_{3-u}Ca_uFe_{5-(u/2+v)}M^8{}_{u/2}M^9{}_vO_{12} \qquad \text{VI}$$

wherein R is at least one element selected from the group consisting of Y, Gd, Tb and Yb and $M^8$ is V or Sb or a mixture of these elements, $M^9$ is at least one element selected from the group consisting of Al, Ga, In and Sc, u represents the molar ratio index of Ca and also the molar ratio index of the substituent element $M^8$ and v represents the molar ratio index of the substituent element $M^9$; the c-site component is constituted of R and Ca. Namely, at the c-site, the above-mentioned Y and-/or a rare earth element represented by R have in part been substituted by $Ca^{2+}$. This Ca component serves to improve the sinterability.

The a-site component and d-site component correspond to the substituent element $M^3$ in Formula III, the substituent elements $M^4$ and $M^5$ in Formula IV, the substituent elements $M^6$ and $M^7$ in Formula V and the substituent elements $M^8$ and $M^9$ in Fromula VI. The substituent element $M^3$ in Formula III, the substituent element $M^4$ in Formula IV, the substituent element $M^6$ in Formula V or the substituent element $M^8$ in Formula VI is incorporated to substitute the Fe sites so as to maintain electrical neutrality in relation to the $Ca^{2+}$ ions present at the c-site. The substituent element $M^5$ in Formula IV, the substituent element $M^7$ in Formula V or the substituent element $M^9$ in Formula VI is an element which is present in a three-valence form and substitutes $Fe^{3+}$ equivalently so as to change the magnetic characteristics such as the saturation magnetization, the Curie temperature and the like and to contribute to the improvement of the crystallizability. Similarly to the a-site component and the d-site component in the garnet ferrite represented by Formulae I and II, when the amount of the a-site component substituted and the amount of the d-site component substituted increase, the a-site component and d-site component may be replaced with each other.

When the composition of the single crystal of the garnet ferrite obtainable by this invention is represented by Formula VII:

$$R^1_{3-(a+b)}R^2_bCa_aFe_{5-(a+c)}M^{10}_aM^{11}_cO_{12} \qquad \text{VII}$$

wherein $R^1$ is at least one element selected from the group consisting of Y, Gd, Tb and Yb, $R^2$ is at least one element selected from the group consisting of lanthanum (La), cerium (Ce), praseodymium (Pr) and neodymiun (Nd), $M^{10}$ is at least one element selected from the group consisting of Ge, Si, Sn, Zr and Ti, $M^{11}$ is at least one element selected from the group consisting of Al, Ga, In and Sc, a represents the molar ratio index of Ca and also the molar ratio index of the substituent element $M^{10}$, b represents the molar ratio index of $R^2$ and c represents the molar ratio index of the substituent element $M^{11}$; or is represented by Formula VIII:

$$R^1_{3-(d+e)}R^2_eCa_dFe_{5-(d/2+f)}M^{12}_{d/2}M^{13}_fO_{12} \qquad \text{VIII}$$

wherein $R^1$ is at least one element selected from the group consisting of Y, Gd, Tb and Yb and $R^2$ is at least one element selected from the group consisting of La, Ce, Pr and Nd, $M^{12}$ is at least one element selected from the group consisting of V and Sb and $M^{13}$ is at least one element selected from the group consisting of Al, Ga, In and Sc, d represents the molar ratio index of Ca, e represents the molar ratio index of $R^2$ and f represents the molar ratio index of the substituent element $M^3$; the c-site component is constituted of $R^1$, $R^2$ and Ca. In particular, at the c-site, the Y and/or a rare earth element represented by $R^1$ have in part been substituted by one or more selected from the group consisting of the other rare earth elements, La, Ce, Pr and Nd, and $Ca^{2+}$. Among the substituent elements in the c-site, Ca component serves to improve the sinterability and the substituent element $R^2$ component serves to increase the Faraday rotation.

The a-site component and the d-site component correspond to the substituent elements $M^{10}$ and $M^{11}$ in Formula VII and the substituent elements $M^{12}$ and $M^{13}$ in Formula VIII. The substituent element $M^{10}$ in Formula VII or the susbstituent element $M^{12}$ in Formula VIII is incorporated to substitute the Fe sites so as to maintain electrical neutrality in relation to the $Ca^{2+}$ ions present at the c-site. The substituent element $M^{11}$ in Formula VII or the substituent element $M^{13}$ in Formula VIII is an element which is present in a three-valence form and substitutes $Fe^{3+}$ equivalently so as to change the magnetic characteristics such as the saturation magnetization, the Curie temperature and the like and to contribute to the improvement of the crystallizability. Similarly to the a-site component and the d-site component in the garnet ferrite represented by Formulae I to VI, when the amount of the a-site component substituted and the amount of the d-site component substituted increase, the a-site component and d-site component may be replaced with each other.

In the process of this invention, the oxides of components to be positioned at the respective sites in a grown single crystal are employed as starting raw materials. Thus, when a single crystal of garnet ferrite represented by Formulae I to VI is prepared, it is possible to use as raw materials for the c-site component an oxide of Y and/or a rare earth element such as $Y_2O_3$ $Gd_2O_3$, $Tb_4O_7$ and $Yb_2O_3$ and the like, and CaO or a compound capable of being converted into CaO in the course of the sintering step, for example, $CaCO_3$.

When a single crystal of garnet ferrite represented by Formula VII or VIII is prepared, an oxide such as $La_2O_3$, $CeO_2$, $Pr_6O_{11}$, $Nd_2O_3$ and the like may be additionally added as the raw materials for the c-site component.

When a single crystal of garnet ferrite represented by Formula I, II or III is prepared, $SnO_2$, $ZrO_2$, $TiO_2$, $Sb_2O_3$, $V_2O_5$, $GeO_2$, $SiO_2$ and the like may be mentioned as raw materials for the a-site component and d-site component. Further, when a single crystal of garnet ferrite represented by Formula IV to VIII is prepared, $SnO_2$, $ZrO_2$, $TiO_2$, $GeO_2$, $SiO_2$, $Sb_2O_3$, $V_2O_5$, $Al_2O_3$, $Ga_2O_3$, $In_2O_3$, $Sc_2O_3$ and the like may be mentioned as raw materials for the a-site component and d-site component.

These oxides, each in the form of powder having a grain size of 50 μm or smaller, may be mixed in a predetermined proportion ratio and then the resultant mixed powder may be sintered under conditions which will be described hereinafter.

The proportion ratios are determined in accordance with the composition of each single crystal of the desired garnet ferrite:

(1) Where the composition of a single crystal is represented by Formula I, the relative proportions of the respective raw materials may be determined in such a way that the molar ratio index x of Ca satisfies the following equation:

$$0.01 \leq x \leq 1.0$$

If x should be smaller than 0.01, namely, the amount of substituent Ca is too small, the sinterability will be reduced and also pores will readily exist in the crystals even if single crystals are caused to grow. If x should exceeds 1.0 on the contrary, the Faraday rotation of the resulting single crystal will be lowered.

(2) Where the composition of a single crystal is represented by Formula II, the relative proportions of the respective raw materials may be determined in such a way that the index y satisfies the following equation:

$$0.005 \leq y \leq 0.50$$

Reasons for the above numerical limitation to y are the same as the above-described reasons for the limitation to x in item (1).

(3) Where the composition of a single crystal is represented by Formula III, the relative proportions of the respective raw materials may be determined in such a way that the molar ratio index k of Ca satisfies the following equation:

$$0.01 \leq k \leq 1.0$$

and the molar ratio index l of the substituent element $M^3$ satisfies the following equation:

$$l = k/(\alpha - 3)$$

(wherein $\alpha$ represents an ionic valence of the $M^3$ ion).

Reasons for the above numerical limitation to k or l are the same as the above-described reasons for the limitation to x in item (1) and the limitation to y in item (2).

(4) Where the composition of a single crystal is represented by Formula IV, the relative proportions of the respective raw materials may be determined in such a way that the molar ratio index m of Ca satisfies the following equation:

$$0.01 \leq m \leq 1.0$$

and the molar ratio index n of the substituent element $M^5$ satisfies the following equation:

$$0.01 \leq n \leq 1.0$$

Reasons for the above numerical limitation to m are the same as the above-described reasons for the limitation to x in item (1), the limitation to y in item (2) and the limitation to k in item (3). If the amount of the substituent element $M^5$ n should be smaller than 0.01, effects will not be exhibited on the improvement in the sinterability, and if n should exceeds 1.0 on the contrary, the Curie temperature is lowered to room temperature or less and the obtained single crystal cannot be used practically as magnetooptical elements.

(5) Where the composition of a single crystal is represented by Formula V, the relative proportions of the respective raw materials may be determined in such a way that the molar ratio index p of Ca satisfies the following equation:

$$0.01 \leq p \leq 1.0$$

and the molar ratio index q of the substituent element $M^6$ satisfies the following equation:

$$q = p/(\beta - 3)$$

(wherein, $\beta$ represents an ion valence of the $M^6$ ion). Reasons for the above numerical limitation to p or r are the same as the above-described reasons for the limitation to m or n in item (4).

(6) Where the composition of a single crystal is represented by Formula VI, the relative proportions of the respective raw materials may be determined in such a way that the molar ratio index u of Ca satisfies the following equation:

$$0.01 \leq u \leq 1.0$$

and the molar ratio index v of the substituent element $M^9$ satisfies the following equation:

$$0.01 \leq v \leq 1.0$$

Reasons for the above numerical limitation to u or v are the same as the above-described reasons for the limitation to m and n in item (4).

(7) Where the composition of a single crystal is represented by Formula VII, the relative proportions of the respective raw materials may be determined in such a way that the molar ratio index a of Ca satisfies the following equation:

$$0.01 \leq a \leq 1.0$$

and the molar ratio index b of the substituent element $R^2$ satisfies the following equation:

$$0.01 \leq b \leq 2.0$$

and the molar ratio index c of the substituent element $M^{11}$ satisfies the following equation:

$$0.01 \leq c \leq 1.0$$

Reasons for the above numerical limitation to a or c are the same as the above-described reasons for the limitation to m or n in item (4). If b should be smaller than 0.01, namely, the amount of $R^2$ substituted is too small, the increase in the Faraday rotation will be insufficient, and if b should exceeds 2.0 on the contrary, the garnet structure can not be maintained to precipitate other phases than garnet, resulting in remarkable deterioration of the optical characteristics.

(8) Where the composition of a single crystal is represented by Formula VIII, the relative proportions of the respective raw materials may be determined in such a way that the molar ratio index d of Ca satisfies the following equation:

$$0.01 \leq d \leq 1.0$$

and the molar ratio index e of the substituent element $R^2$ satisfies the following equation:

$$0.01 \leq e \leq 2.0$$

and the molar ratio index f of the substituent element $M^{13}$ satisfies the following equation:

$$0.01 \leq f \leq 1.0$$

The reasons for the above numerical limitation to d, e or f are the same as the above-described reasons for the limitation to a, b or c in item (7).

In the single crystals practically obtained, the respective composition may be slightly deviated from the stoichiometric composition represented by Formula I, II, III, IV, V, VI, VII or VIII.

The respective raw materials are formulated in the relative proportion described above and are then thoroughly mixed, for example, in a wet ball mill. The resulting mixed powder is filled, for example, in an alumina crucible and is then sintered.

In the process for producing a single crystal of the garnet ferrite according to this invention, sintering may be carried out in advance within a temperature range in which the densification of the raw materials for the garnet ferrite proceeds and then within a temperature range in which the grain growth is induced.

More specifically, the garnet ferrite polycrystals were heated and sintered at various temperatures. As a result, it was confirmed experimentally that the relative density of the thus heat-treated polycrystal reaches a value of about 100% at a specific temperature range and when the sintering temperature becomes higher than this temperature range, the relative density drops slightly. Moreover, the upper limit of the temperature range in which the relative density of the polycrystal reaches to a value of about 100% by densification corresponds to substantially the lower limit of the temperature range in which the growth of single crystal of the garnet ferrite is induced. Accordingly, when a single crystal of the garnet ferrite is a polycrystal of the raw materials for the garnet ferrite subjected to sintering within a temperature range in which the densification of the polycrystal of the garnet ferrite proceeds. In a subsequent step, the polycrystal thus densified is then subjected to sintering within a temperature range in which an anomalous grain growth is induced, thereby growing a single crystal.

Further, in the process for producing a single crystal of the garnet ferrite according to this invention, it is also possible to seed a single crystal having the same structure as that of a resultant single crystal of the garnet ferrite, onto the raw materials for the garnet ferrite prior to the sintering of the raw materials for the garnet ferrite in the temperature range in which the grain growth is induced.

In case where the densification is carried out prior to grain growth of the garnet ferrite, it is possible to seed a single crystal having the same structure as that of a resultant single crystal of the garnet ferrite onto the raw materials for the garnet ferrite prior to to the sintering of the raw materials for the garnet ferrite in the temperature range in which the densification proceeds. Alternatively, it is also possible to seed a single crystal having the same structure as that of a resultant single crystal of the garnet ferrite onto densified raw materials for the garnet ferrite, after the sintering of the raw materials for the garnet ferrite within the temperature range in which the densification proceeds.

The seed crystal to be seeded may be any one having the same structure as that of a resultant single crystal whether the composition thereof is the same as that of a resultant single crystal of the garnet ferrite or not. Namely, as the seed crystal, there may be used, for example, yttrium-iron-garnet (YIG) or gadolinium-iron-garnet (GdIG), which is a resultant single crystal of the garnet ferrite, or other single crystal, for example, gadolinium-gallium-garnet (GdGaG), samarium-gallium-garnet (SmGaG) or neodymium-gallium-garnet (NdGaG), which has the same structure as but has a composition different from that of a resultant single crystal.

The reasons why such seeding with a seed crystal is preferably effected can be considered to be based on the following:

When a single crystal of the garnet ferrite is caused to grow, the resulting single crystal preferably has a grain size of at least 1 mm and in case where a single crystal has a grain size less than 1 mm, it is difficult to put it to practical use. In this respect, it is desirable to obtain a spontaneously induced large crystal, i.e., a single crystal, by maintaining the raw materials for the garnet ferrite within the temperature range in which the grain growth, particularly the anomalous grain growth is induced. However, when the growth of a single crystal of the garnet ferrite is induced to obtain a single crystal having a desired grain size, it is required to control the number of the crystal grains to be caused to induce the anomalous grain growth. In case where the number of the crystal grains to be caused to induce the anomalous growth grains is too many, the adjacent crystal grains grown to a certain size prevent the grain growth with each other, and as a result the the growth of all grains is stopped before some of grains are caused to grow to a sufficient size. Therefore, if the number of crystal grains to be caused to induce the anomalous grain growth is controlled, the single crystal of the garnet ferrite having a desired grain size is considered to be obtained easily.

The sintering may be effected in an oxygen flow. Although the sintering temperature may vary depending on, for example, the composition of the proportioned powdery raw materials, it is desirable to set the sintering temperature at such a level that ferrite grains having the garnet structure are allowed to grow from the mixed powder irrespective of the crystalline state of the resulting garnet ferrite, namely, no matter whether the garnet ferrite is single crystals or polycrystals. And it is particularly preferable to set the sintering temperature at a level where the above described anomalous grain growth is induced. When a single crystal represented by Formulae I to VIII is desired, the sintering temperature is set preferably within a range of from 1450° to 1550° C., although the sintering temperature may vary depending on the composition of the formulated powder. If the sintering temperature should be lower than 1450° C., liquid phases will not be generated sufficiently during the sintering and the anomalous grain growth will be induced with difficulty. On the other hand, any temperatures higher than 1550° C. will result in precipitation of other phases than garnent owing to the decomposition reaction of the garnet, leading to absorption of light.

However, the relative density of a polycrystal of the garnet ferrite is densified in a temperature range lower than the tempreature range in which the anomalous grain growth is induced as described above. Namely, although the relative density of a polycrystal of the garnet ferrite varies depending upon the formulation composition of the powdery raw material, it increases gradually as the sintering temperature increases until the temperature reaches a specific sintering temperature range. And when the sintering temperature reaches the specific temperature range, it becomes about 100%. When the sintering temperature exceeds the specific temperature range, the relative density of the polycrystal of the garnet ferrite slightly decreases. On the other hand, the upper limit of the temperature range in which the relative density reaches a value of about 100% is coincident with the temperature range in which grain growth is induced. Therefore in the process of this invention, when, for example, a single crystal of the garnet ferrite represented by Formulae I to VIII is intended to grow, the raw materials for the garnet ferrite are preferably sintered in the densification temperature range in which the relative density reaches a value of about 100% prior to the sintering in the temperature range in which grain growth is induced, so that a garnet ferrite having a relative density of about 100% can be obtained.

In case where the above described densification is effected prior to grain growth of the garnet ferrite single crystal, pre-sintering is preferably effected in a temperature range between 1350° to 1450° C. for the growth of a single crystal of the garnet ferrite represented by Formulae I to VIII. If this sintering temperature is lower than 1350° C., the precipitation of liquid phase during the sintering will be insufficient to fill up the gaps in the sintered body, so that polycrystal of the garnet ferrite having high density cannot be obtained. On the other hand, if the sintering temperature is higher than 1450° C. the grains of the garnet ferrite single crystal begin to grow to decrease the relative density slightly.

In this invention, the seeding of the seed crystal can be effected by any of the following methods.

In the first method, mixed powder which has been prepared by formulating each raw materials in the above described ratio and mixing thoroughly the resulting mixture, for example, in a wet ball mill, is packed, for example, in an aluminium crucible, and then the predetermined number of the seed crystals having the desired structure are added to the raw material mixture before the sintering.

In the second method, mixed powder which has been prepared by formulating each raw materials in the above described ratio and mixing thoroughly the resulting mixture, for example, in a wet ball mill, is packed, for example, in an aluminium crucible, and pre-sintered for the predetermined period in the densification temperature range, and then onto the resulting pre-sintered body the predetermined number of the seed crystals having the desired structure are seeded prior to the sintering in the grain growth temperature range, and subsequently the sintering in the grain growth temperature range is effected to cause a single crystal to grow.

In addition to the sintering temperature, the sintering time is also a factor which affects the growth of a single crystal. It is generally preferable to set the sintering time within a range between 0.5 and 24 hours.

Since the grain growth rate is significantly dependent on a grain size of a polycrystalline body during the sintering, a polycrystalline body has preferably a grain size of 100 μm or smaller.

A single crystal with good quality may also be obtained in an alternative manner. Namely, the above-mentioned mixed powder is first of all calcined at a lower temperature to form a polycrystalline ferrite body of the garnet structure without sintering the mixed powder directly under the above-described sintering conditions. The resulting polycrystalline ferrite body is then sintered at temperatures within the above-given temperature range.

A grown single crystal of the garnet ferrite can now be cut off from the thus-obtained sintered body according to the cutting method or the like to form a predetermined shape.

In the process for producing a single crystal of the garnet ferrite according to this invention, by sintering the raw materials for the garnet ferrite in the temperature range in which grain growth, particularly anomalous grain growth is induced, the c-site component in the resulting garnet structured ferrite is substituted with calcium and a rare earth element, in such a manner that they are selectively positioned at a desired site, the sinterability can be improved by incorporation of the calcium, and a single crystal having a large Faraday rotation can be obtained by incorporation of the rare earth, for example, La, Ce, Pr and Nd. Further, in this invention, the a-site component and the d-site component in five iron atoms are substituted with at least one element selected from the group consisting of Ge, Si, Sb, V, Sn, Zr and Ti, and with at least one element selected from the group consisting of Al, Ga, In and Sc, in such a manner that they are selectively positioned at a desired site, while maintaining exchangability with each other. In the resulting garnet structured ferrite, Ca component serves to improve the sinterability and La, Ce, Pr or Nd component contributes to obtain a single crystal having a large Faraday rotation. Incorporation of Ge, Si, Sb, V, Sn, Zr, Ti, Al, Ga, In or Sc serves to maintain the electrical neutrality in relation to the $Ca^{2+}$ ions and at the same time to change the magnetic characteristics such as the saturation magnetization and the Curie temperature.

The present invention will hereinafter be described in more detail by the following Examples. However, this invention will not be limited by the following Examples.

EXAMPLE

EXAMPLES 1 TO 13

Preparation of garnet ferrites of Formulae I and II

In order to obtain garnet-structured ferrites having a composition shown in Table 1, powdery oxides of the respective site components were weighed. The oxides may be, for example, $Y_2O_3$, $Gd_2O_3$, $Tb_4O_7$, $Yb_2O_3$, $CaCO_3$, $FeOOH$, $GeO_2$, $SiO_2$, $V_2O_5$, $SnO_2$, $TiO_2$, $ZrO_2$ and $Sb_2O_3$. The respective powdery raw materials were formulated and mixed for 24 hours in a wet ball mill and then dried. Each of the thus-prepared mixed powder samples was granulated and the granulated powder sample was filled in an alumina crucible, in which it was calcined at 1100° C. for 4 hours in the atmosphere. The calcined powder was again ground in a wet ball mill, followed by drying. Each of the thus-obtained powder samples had a composition given in Table 1, respectively.

To each of the powder samples a suitable amount of an aqueous solution of polyvinyl alcohol was added. The resultant mass samples were each press-molded under a pressure of 1 ton/cm$^2$, thereby obtaining pellets having a diameter of 20 mm and a thickness of 5 mm.

In the streaming of oxygen, the respective pellet samples were sintered for 8 hours at their respective temperatures which are also given in Table 1. The densities of the thus-obtained sintered bodies were measured by the Archimedean principle to calculate their relative densities (%) based respectively on their theoretical densities. Furthermore, the surfaces of the sintered bodies were polished and were then subjected to etching. Thereafter, the average grain sizes of crystal grains constituting the sintered bodies other than the resultant largely grown single crystal grains, and the maximum crystal grain size of the resultant largely grown single crystal grains, were measured. Results are collectively shown in Table 1.

TABLE 1

| | Composition | Sintering temp. (°C.) | Relative density (%) | Average grain size (μm) | Maximum grain size of single crystal (mm) |
|---|---|---|---|---|---|
| Ex. 1 | $Y_{2.5}Ca_{0.5}Fe_{4.5}Ge_{0.5}O_{12}$ | 1450 | 98.0 | 10 | 2.0 |
| Ex. 2 | $Y_{2.5}Ca_{0.5}Fe_{4.5}Ge_{0.5}O_{12}$ | 1500 | 99.8 | 5 | 10.0 |
| Ex. 3 | $Y_{2.5}Ca_{0.5}Fe_{4.5}Ge_{0.5}O_{12}$ | 1550 | 99.8 | 3 | 15.0 |
| Ex. 4 | $Y_{2.99}Ca_{0.01}Fe_{4.99}Ge_{0.01}O_{12}$ | 1500 | 99.6 | 10 | 5.0 |
| Ex. 5 | $Y_2Ca_1Fe_4Ge_1O_{12}$ | 1500 | 99.9 | 5 | 12.0 |
| Ex. 6 | $Gd_{2.5}Ca_{0.5}Fe_{4.5}Si_{0.5}O_{12}$ | 1500 | 99.8 | 8 | 10.0 |
| Ex. 7 | $Y_{2.5}Ca_{0.5}Fe_{4.75}V_{0.25}O_{12}$ | 1500 | 99.9 | 8 | 10.0 |
| Ex. 8 | $Gd_{2.5}Ca_{0.5}Fe_{4.75}Sb_{0.25}O_{12}$ | 1500 | 99.6 | 8 | 10.0 |
| Ex. 9 | $Yb_{2.5}Ca_{0.5}Fe_{4.5}Ge_{0.5}O_{12}$ | 1500 | 99.9 | 10 | 10.0 |
| Ex. 10 | $Tb_{2.5}Ca_{0.5}Fe_{4.5}Ge_{0.5}O_{12}$ | 1500 | 99.9 | 10 | 10.0 |
| Ex. 11 | $Y_{2.5}Ca_{0.5}Fe_{4.5}Sn_{0.5}O_{12}$ | 1500 | 99.9 | 10 | 10.0 |
| Ex. 12 | $Y_{2.5}Ca_{0.5}Fe_{4.5}Zr_{0.5}O_{12}$ | 1500 | 99.9 | 10 | 10.0 |

TABLE 1-continued

| | Composition | Sintering temp. (°C.) | Relative density (%) | Average grain size (μm) | Maximum grain size of single crystal (mm) |
|---|---|---|---|---|---|
| Ex. 13 | $Y_{2.5}Ca_{0.5}Fe_{4.5}Ti_{0.5}O_{12}$ | 1500 | 99.9 | 10 | 10.0 |

According to the process of this invention, it was possible to obtain very large single ferrite crystals of the garnet structure.

EXAMPLE 14

The average grain size and the relative density of the garnet ferrite of Formula I as a function of the sintering temperature:

By choosing the kinds and relative proportions of raw material to give a composition of $Y_{2.5}Ca_{0.5}Fe_{4.5}Ge_{0.5}O_{12}$, pellets were formed in the same manner as in Example 1. The resultant pellets were sintered at varied temperatures. The average grain sizes and relative densities of the sintered bodies obtained respectively at the different temperatures were measured. The average grain size and the relative density are plotted as a function of the sintering temperature (FIG. 1).

As apparent from FIG. 1, when the sintering temperature is 1450° C. or higher, the average grain size of the sintered body decreased abruptly and the growth of crystal grains proceeded markedly. However, when the sintering temperature exceeded 1550° C., the relative density of the sintered body began to drop.

EXAMPLE 15

Figure 2:
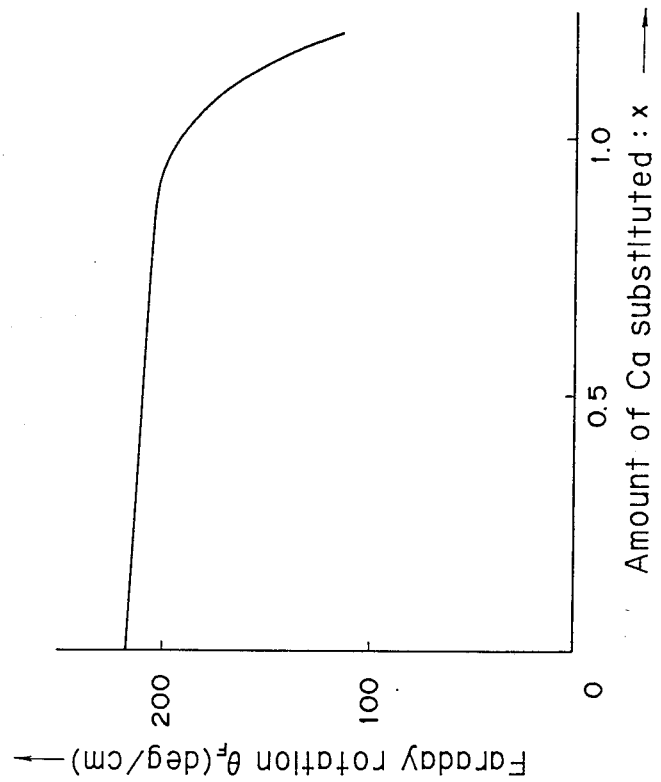
FIG. 2 shows Faraday rotation as a function of the amount x of the substituent Ca in a single crystal having a composition of $Y_{2.5}Ca_xFe_{5-x}Ge_xO_{12}$ in Example 15.

Relationship between the degree of Faraday rotation and the amount of substituent Ca in the garnet ferrite of Formula I By changing the amount x of the substituent Ca, single crystals of the following formula:

$Y_{3-x}Ca_xFe_{5-x}Ge_xO_{12}$ were respectively caused to grow in the same manner as in Example 1:

The resultant single crystals were cut off from their corresponding sintered bodies. After applying optical polishing treatment to the single crystals, their Faraday rotations $\theta_F$ (deg/cm) were measured by a semiconductor laser having a wavelength of 1.3 μm. Measurement results are diagrammatically shown in FIG. 2. As is apparent from FIG. 2, $\theta_F$ began to drop disadvantageously when the amount of the substituent Ca became greater than 1.0.

EXAMPLES 16 TO 26

Preparation of garnet ferrites of Formulae IV and VI

In order to obtain garnet-structured ferrites having a composition shown in Table 2, powdery oxides of the respective site components were weighed. The oxides may be, for example, $Y_2O_3$, $Gd_2O_3$, $Tb_4O_7$, $Yb_2O_3$, $CaCO_3$, $FeOOH$, $GeO_2$, $SiO_2$, $V_2O_5$, $SnO_2$, $TiO_2$, $Sb_2O_3$, $ZrO_2$, $Al_2O_3$, $Ga_2O_3$, $In_2O_3$ and $Sc_2O_3$. The respective powdery raw materials were formulated and mixed for 24 hours in a wet ball mill and then dried. Each of the thus-prepared mixed powder samples was granulated and the granulated powder sample was filled in an alumina crucible, in which it was calcined at 1100° C. for 4 hours in the atmosphere. The calcined body was again ground in a wet ball mill, followed by drying. Each of the thus-obtained powder samples had a composition given in Table 2, respectively.

To each of the powder samples a suitable amount of an aqueous solution of polyvinyl alcohol was added. The resultant mass samples were each press-molded under a pressure of 1 ton/cm², thereby obtaining pellets having a diameter of 20 mm and a thickness of 5 mm.

In the streaming of oxygen, the respective pellet samples were sintered for 8 hours at their respective temperatures which are also given in Table 2. The densities of the thus-obtained sintered bodies were measured by the Archimedean principle to calculate their relative densities (%) based respectively on their theoretical densities. Furthermore, the surfaces of the sintered bodies were polished and were then subjected to etching. Thereafter, the average grain sizes of crystal grains constituting the sintered bodies other than the resultant largely grown single crystal grains, and the maximum crystal grain size of the resultant largely grown single crystal grains were measured. Results are collectively shown in Table 2.

TABLE 2

| | Composition | Sintering temp. (°C.) | Relative density (%) | Average grain size (μm) | Maximum grain size of single crystal (mm) |
|---|---|---|---|---|---|
| Example 16 | $Y_{2.5}Ca_{0.5}Fe_{4.0}Ge_{0.5}Al_{0.5}O_{12}$ | 1450 | 99.0 | 10 | 5.0 |
| Example 17 | $Y_{2.5}Ca_{0.5}Fe_{4.0}Ge_{0.5}Al_{0.5}O_{12}$ | 1500 | 99.9 | 5 | 12.0 |
| Example 18 | $Y_{2.5}Ca_{0.5}Fe_{4.0}Ge_{0.5}Al_{0.5}O_{12}$ | 1550 | 99.9 | 3 | 18.0 |
| Example 19 | $Y_{2.99}Ca_{0.01}Fe_{4.98}Ge_{0.01}Al_{0.01}O_{12}$ | 1500 | 99.9 | 5 | 5.0 |
| Example 20 | $Y_2Ca_1Fe_3Ge_1Al_1O_{12}$ | 1500 | 99.9 | 5 | 15.0 |
| Example 21 | $Gd_{2.5}Ca_{0.5}Fe_{4.0}Si_{0.5}Ga_{0.5}O_{12}$ | 1500 | 99.9 | 8 | 10.0 |
| Example 22 | $Tb_{2.5}Ca_{0.5}Fe_{4.0}Sn_{0.5}In_{0.5}O_{12}$ | 1500 | 99.9 | 8 | 10.0 |
| Example 23 | $Yb_{2.5}Ca_{0.5}Fe_{4.0}Zr_{0.5}Sc_{0.5}O_{12}$ | 1500 | 99.9 | 8 | 10.0 |
| Example 24 | $Y_{2.5}Ca_{0.5}Fe_{4.0}Ti_{0.5}Al_{0.5}O_{12}$ | 1500 | 99.9 | 8 | 10.0 |
| Example 25 | $Gd_{2.5}Ca_{0.5}Fe_{4.25}Sb_{0.25}Ga_{0.5}O_{12}$ | 1500 | 99.9 | 8 | 10.0 |
| Example 26 | $Y_{2.5}Ca_{0.5}Fe_{4.25}V_{0.25}In_{0.5}O_{12}$ | 1500 | 99.9 | 8 | 10.0 |

According to the process of this invention, it is possible to obtain very large single ferrite crystals of the garnet structure.

EXAMPLE 27

The average grain size and the relative density of the garnet ferrite of Formula IV as a function of the sintering temperature:

By choosing the kinds and relative proportions of raw material to give a composition of $Y_{2.5}Ca_{0.5}Fe_{4.0}Ge_{0.5}Al_{0.5}O_{12}$, pellets were formed in the same manner as in Example 16. The resultant pellets were sintered at varied temperatures. The average grain sizes and relative densities of the sintered bodies obtained respectively at the different temperatures were measured. The average grain size and relative density are plotted as a function of the sintering temperature (FIG. 3).

Figure 3:
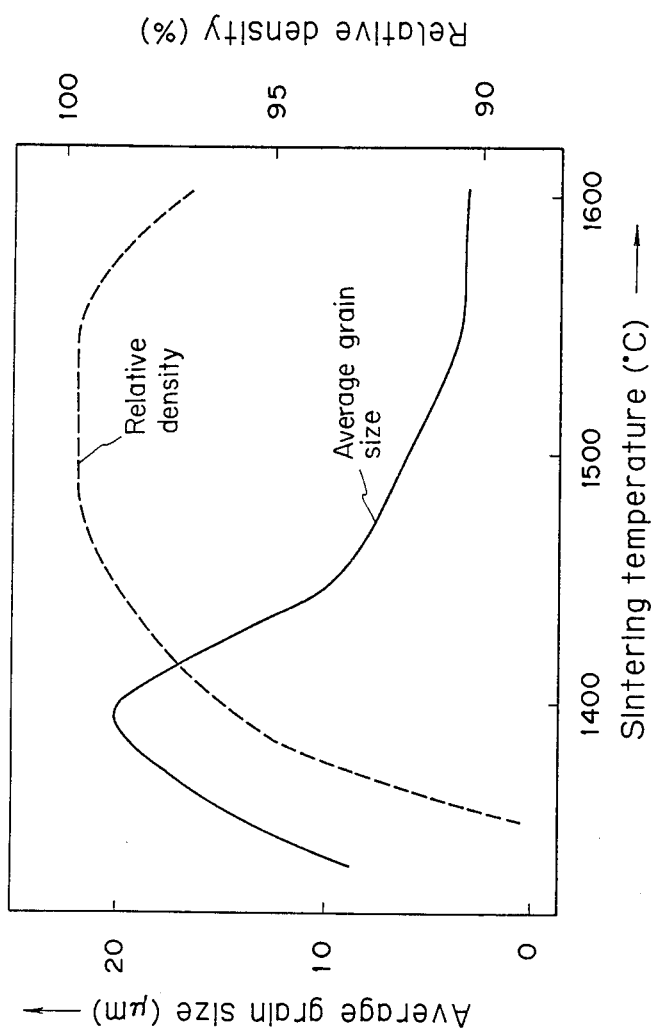
FIG. 3 shows the average grain size and the relative density of a sintered body having a composition of $Y_{2.5}Ca_{0.5}Fe_{4.0}Ge_{0.5}Al_{0.5}O_{12}$ in Example 27 as a function of the sintering temperature.

As apparent from FIG. 3, when the sintering temperature is 1450° C. or higher, the average grain size of the sintered body decreased abruptly and the growth of crystal grains proceeded markedly. However, when the sintering temperature exceeded 1550° C., the relative density of the sintered body started dropping.

EXAMPLE 28

Figure 4:
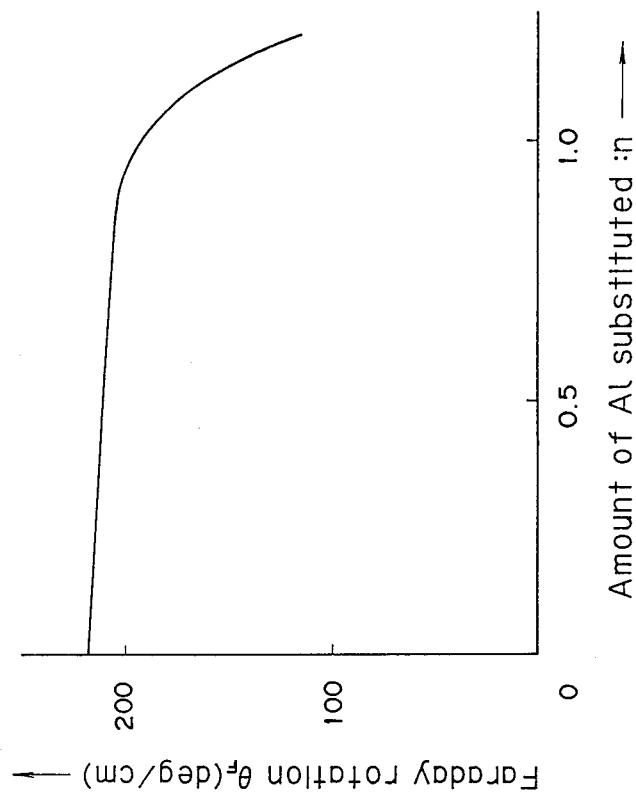
FIG. 4 shows Faraday rotation as a function of the amount n of the substituent Al in a single crystal having a composition of $Y_{2.98}Ca_{0.02}Fe_{4.98-n}Ge_{0.02}Al_nO_{12}$ in Example 28.

Relationship between the degree of Faraday rotation and the amount of substituent Al in the garnet ferrite of Formula IV By changing the amount n of the substituent Al, single crystals of the following formula:

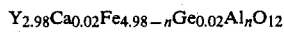

$$Y_{2.98}Ca_{0.02}Fe_{4.98-n}Ge_{0.02}Al_nO_{12}$$

were respectively caused to grow in the same manner as in Example 16:

The resultant single crystals were cut off from their corresponding sintered bodies. After applying optical polishing treatment to the single crystals, their Faraday rotations $\theta_F$ (deg/cm) were measured by a semiconductor laser having a wavelength of 1.3 μm. Measurement results are diagrammatically shown in FIG. 4. As is apparent from FIG. 4, $\theta_F$ began to drop disadvantageously when the amount of the substituent Al became greater than 1.0.

EXAMPLES 29 TO 47

Preparation of garnet ferrites of Formulae III and V in case where the sintering in the grain grow temperature range is effected after the sintering in the densification temperature range is effected In order to obtain garnet-structured ferrites having a composition shown in Table 3, powdery oxides of the respective site components were weighed. The oxides may be, for example, $Y_2O_3$, $Gd_2O_3$, $Tb_4O_7$, $Yb_2O_3$, $CaCO_3$, $FeOOH$, $GeO_2$, $SiO_2$, $V_2O_5$, $SnO_2$, $TiO_2$, $Sb_2O_3$, $ZrO_2$, $Al_2O_3$, $Ga_2O_3$, $In_2O_3$ and $Sc_2O_3$. The respective powdery raw materials were formulated and mixed for 24 hours in a wet ball mill and then dried. Each of the thus-prepared mixed powder samples was granulated and the granulated powder sample was filled in an alumina crucible, in which it was calcined at 1100° C. for 4 hours in the atmosphere. The calcined body was again ground in a wet ball mill, followed by drying. Each of the thus-obtained powder samples had a composition given in Table 3, respectively To each of the powder samples a suitable amount of an aqueous solution of polyvinyl alcohol was added. The resultant mass samples were each press-molded under a pressure of 1 ton/cm², thereby obtaining pellets having a diameter of 20 mm and a thickness of 5 mm.

In the streaming of, the respective pellet samples were sintered for 8 hours within a temperature range in which densification proceeds indicated in Table 3 and then sintered for 8 hours within a temperature range in which grain growth is induced indicated in Table 3. The densities of the thus-obtained sintered bodies were measured by the Archimedean principle to calculate their relative densities (%) based respectively on their theoretical densities. Furthermore, the surfaces of the sintered bodies were polished and were then subjected to etching. Thereafter, the average grain sizes of crystal grains constituting the sintered bodies other than the resultant largely grown single crystal grains, and the maximum crystal grain size of the resultant largely grown single crystal grains were measured. Results are collectively shown in Table 3.

TABLE 3

| | Composition | Sintering temperature (°C.) densification | Sintering temperature (°C.) growth of grains | Relative density (%) | Average grain size (μm) | Maximum grain size of single crystal (mm) |
|---|---|---|---|---|---|---|
| Example 29 | $Gd_{2.8}Ca_{0.2}Fe_{4.3}Ge_{0.2}Al_{0.5}O_{12}$ | 1350 | 1500 | 99.8 | 10 | 12.0 |
| Example 30 | $Gd_{2.8}Ca_{0.2}Fe_{4.3}Ge_{0.2}Al_{0.5}O_{12}$ | 1400 | 1500 | 99.9 | 10 | 12.0 |
| Example 31 | $Gd_{2.8}Ca_{0.2}Fe_{4.3}Ge_{0.2}Al_{0.5}O_{12}$ | 1450 | 1500 | 99.9 | 10 | 12.0 |
| Example 32 | $Gd_{2.8}Ca_{0.2}Fe_{4.3}Ge_{0.2}Al_{0.5}O_{12}$ | 1400 | 1450 | 99.9 | 15 | 5.0 |
| Example 33 | $Gd_{2.8}Ca_{0.2}Fe_{4.3}Ge_{0.2}Al_{0.5}O_{12}$ | 1400 | 1550 | 99.9 | 5 | 18.0 |
| Example 34 | $Gd_{2.99}Ca_{0.01}Fe_{4.99}Ge_{0.01}O_{12}$ | 1400 | 1500 | 99.9 | 8 | 10.0 |
| Example 35 | $Gd_2Ca_1Fe_3Ge_1Al_1O_{12}$ | 1400 | 1500 | 99.9 | 8 | 10.0 |
| Example 36 | $Y_{2.5}Ca_{0.5}Fe_{4.5}Si_{0.5}O_{12}$ | 1400 | 1530 | 99.9 | 10 | 10.0 |
| Example 37 | $Y_{2.5}Ca_{0.5}Fe_4Si_{0.5}Ga_{0.5}O_{12}$ | 1400 | 1530 | 99.9 | 8 | 10.0 |
| Example 38 | $Tb_{2.5}Ca_{0.5}Fe_{4.5}Sn_{0.5}O_{12}$ | 1400 | 1500 | 99.9 | 8 | 10.0 |
| Example 39 | $Tb_{2.5}Ca_{0.5}Fe_4Sn_{0.5}In_{0.5}O_{12}$ | 1400 | 1500 | 99.9 | 5 | 10.0 |
| Example 40 | $Yb_{2.5}Ca_{0.5}Fe_{4.5}Zr_{0.5}O_{12}$ | 1400 | 1500 | 99.9 | 8 | 10.0 |
| Example 41 | $Yb_{2.5}Ca_{0.5}Fe_4Zr_{0.5}Sc_{0.5}O_{12}$ | 1400 | 1500 | 99.9 | 5 | 10.0 |
| Example 42 | $Y_{2.5}Ca_{0.5}Fe_{4.5}Ti_{0.5}O_{12}$ | 1430 | 1530 | 99.9 | 10 | 10.0 |
| Example 43 | $Y_{2.5}Ca_{0.5}Fe_4Ti_{0.5}Al_{0.5}O_{12}$ | 1430 | 1530 | 99.9 | 8 | 10.0 |
| Example 44 | $Gd_{2.5}Ca_{0.5}Fe_{4.75}Sb_{0.25}O_{12}$ | 1400 | 1500 | 99.9 | 8 | 10.0 |
| Example 45 | $Gd_{25}Ca_{0.5}Fe_{4.25}Sb_{0.25}Ga_{0.5}O_{12}$ | 1400 | 1500 | 99.9 | 5 | 10.0 |
| Example 46 | $Y_{2.5}Ca_{0.5}Fe_{4.75}V_{0.25}O_{12}$ | 1400 | 1500 | 99.9 | 10 | 10.0 |
| Example 47 | $Y_{2.5}Ca_{0.5}Fe_{4.25}V_{0.25}In_{0.5}O_{12}$ | 1400 | 1500 | 99.9 | 8 | 10.0 |

According to the process of this invention, it is possible to obtain very large single ferrite crystals of the garnet structure.

Figure 5:
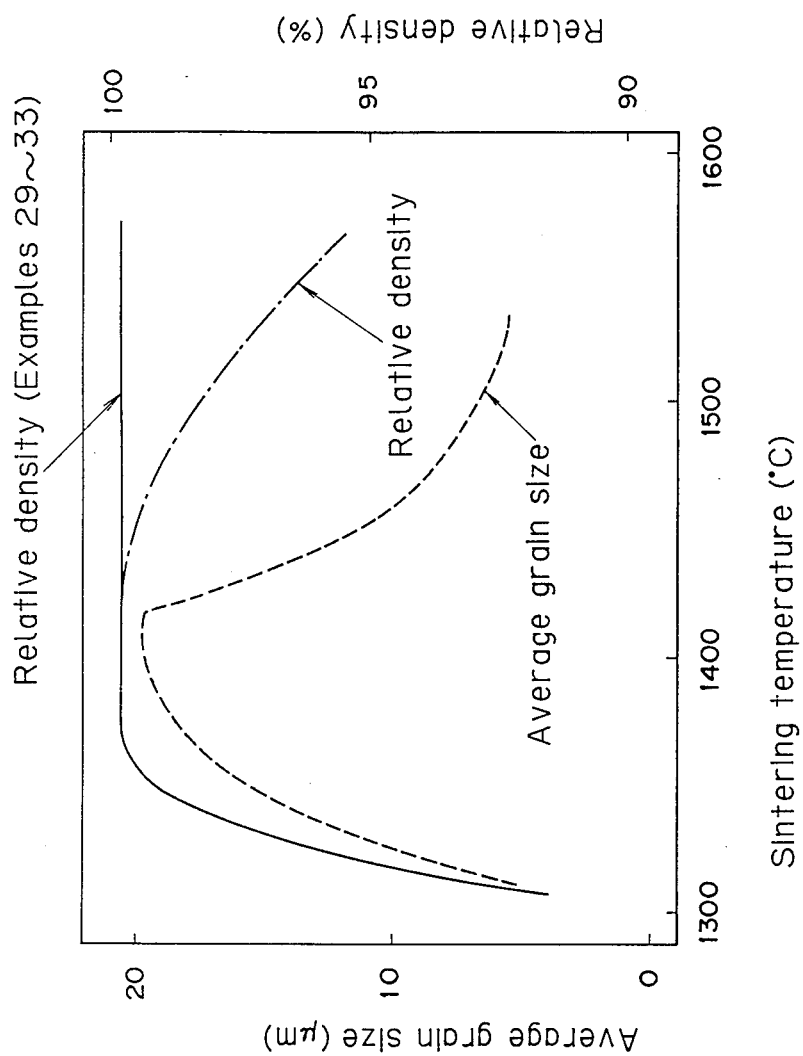
FIG. 5 shows the relative density of a sintered body having a composition of $Gd_{2.8}Ca_{0.2}Fe_{4.3}Ge_{0.2}Al_{0.5}O_{12}$ in Examples 29 to 33 as a function of the sintering temperature.

The relative density of the garnet ferrite of $Gd_{2.8}Ca_{0.2}Fe_{4.3}Ge_{0.2}Al_{0.5}O_{12}$ obtained in Examples 29 to 33 is shown in as a function of the sintering temperature in a solid line in FIG. 5.

Pellets having the same composition as in Example 29 were formed and the resultant pellets were sintered at varied temperatures. The average grain sizes and relative densities of the sintered bodies obtained respectively at the different temperatures were measured. The average grain size and relative density are shown in a dotted line and a chain line, respectively, as a function of the sintering temperature (FIG. 5).

As apparent from FIG. 5, when the sintering temperature is within the range between 1350° C. and 1450° C., densification of the raw materials for the garnet ferrite proceeds, the relative density reaches a value of about 100% and the average grain size also increases. However, when the sintering temperature exceeded 1450° C., the average grain size of the sintered body started dropping, showing that only a small number of crystal grains are caused to grow to larger grains. The average grain size becomes constant when the sintering temperature exceeds 1550° C., indicating that the growth of crystal grains will not proceed any more.

It has been also found that, when raw materials for the garnet ferrite are kept in a temperature range between 1450° and 1550° C. in which grain growth is induced, without sintering within a temperature range in which densification proceeds, the relative density of the thus obtained sintered body drops slightly as the sintering temperature becomes higher.

EXAMPLE 48

Relationship between the degree of Faraday rotation and the amount of substituent Al in the garnet ferrite of Formula V in case where the sintering in the grain growth temperature range is effected after the sintering in the densification temperature range is effected By changing the amount r of the substituent Al, single crystals of the following formula:

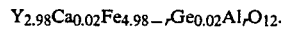

Figure 6:
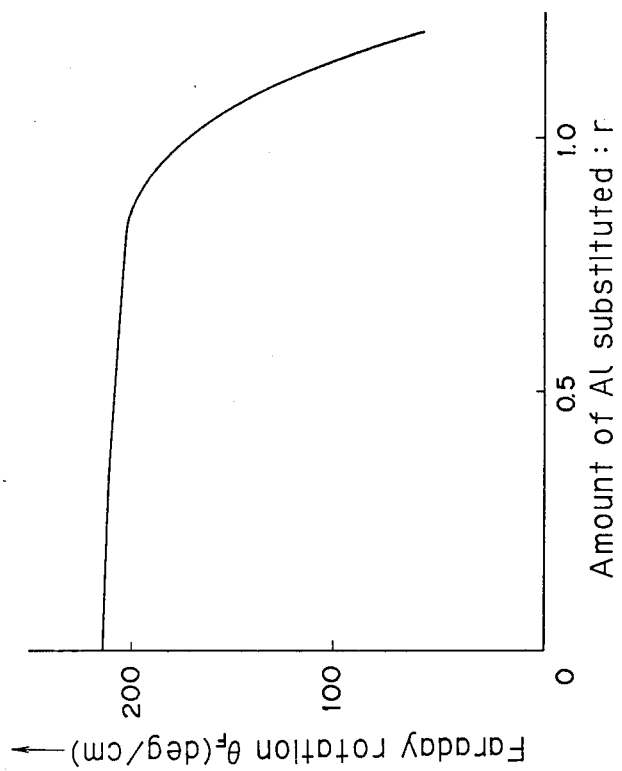
FIG. 6 shows Faraday rotation as a function of the amount r of the substituent Al in a single crystal having a composition of $Y_{2.98}Ca_{0.02}Fe_{4.98-r}Ge_{0.02}Al_rO_{12}$ in Example 48.

$Y_{2.98}Ca_{0.02}Fe_{4.98-r}Ge_{0.02}Al_rO_{12}$.

were respectively caused to grow in the same manner as in Example 29:

The resultant single crystals were cut off from their corresponding sintered bodies. After applying optical polishing treatment to the single crystals, their Faraday rotations $\theta_F$(deg/cm) were measured by a semiconductor laser having a wavelength of 1.3 μm. Measurement results are diagrammatically shown in FIG. 6. As is apparent from FIG. 6, $\theta_F$ began to drop disadvantageously when the amount of the substituent Al became greater than 1.0.

EXAMPLES 49 TO 67

Preparation of garnet ferrites of Formulae III and V in case where seeding is effected prior to the sintering in the densification temperature range and in the grain growth temperature range In order to obtain garnet-structured ferrites having a composition shown in Table 3, powdery oxides of the respective site components were weighed. The oxides may be, for example, $Y_2O_3$, $Gd_2O_3$, $Tb_4O_7$, $Yb_2O_3$, $CaCO_3$, $FeOOH$, $GeO_2$, $SiO_2$, $V_2O_5$, $SnO_2$, $TiO_2$, $Sb_2O_3$, $ZrO_2$, $Al_2O_3$, $Ga_2O_3$, $In_2O_3$ and $Sc_2O_3$. The respective powdery raw materials were formulated and mixed for 24 hours in a wet ball mill and then dried. Each of the thus-prepared mixed powder samples was granulated and the granulated powder sample was filled in an alumina crucible, in which it was calcined at 1100° C. for 4 hours in the atmosphere. The calcined body was again ground in a wet ball mill, followed by drying. The thus-obtained powder samples had their respective composition given in Table 4, respectively.

To each of the powder samples a suitable amount of an aqueous solution of polyvinyl alcohol was added. The resultant mass samples were each press-molded under a pressure of 1 ton/cm², while seeding a single crystal of Yttlium-Iron-Garnet (YIG) having a size of 2×2×2 mm³ obtained by the flux method, thereby obtaining pellets having a diameter of 20 mm and a thickness of 5 mm.

In the streaming of oxygen, the respective pellet samples were sintered for 8 hours within the temperature range in which densification proceeds and sintered for 8 hours within the temperature range in which grain growth is induced. The densities of the thus-obtained sintered bodies were measured by the Archimedean principle to calculate their relative densities (%) based respectively on their theoretical densities. Furthermore, the surfaces of the sintered bodies were polished and were then subjected to etching. Thereafter, the average grain sizes of crystal grains constituting the sintered bodies other than the resultant largely grown single crystal grains, and the maximum crystal grain size of the resultant largely grown single crystal grains were measured. Results are collectively shown in Table 4.

TABLE 4

| | | Sintering temperature (°C.) | | Relative density (%) | Average grain size (μm) | Maximum grain size of single crystal (mm) |
|---|---|---|---|---|---|---|
| | Composition | densification | growth of grains | | | |
| Example 49 | $Gd_{2.8}Ca_{0.2}Fe_{4.3}Ge_{0.2}Al_{0.5}O_{12}$ | | 1500 | 99.8 | 10 | 18.0 |
| Example 50 | $Gd_{2.8}Ca_{0.2}Fe_{4.3}Ge_{0.2}Al_{0.5}O_{12}$ | 1400 | 1500 | 99.9 | 10 | 18.0 |
| Example 51 | $Gd_{2.8}Ca_{0.2}Fe_{4.3}Ge_{0.2}Al_{0.5}O_{12}$ | 1450 | 1500 | 99.9 | 10 | 18.0 |
| Example 52 | $Gd_{2.8}Ca_{0.2}Fe_{4.3}Ge_{0.2}Al_{0.5}O_{12}$ | | 1450 | 99.9 | 15 | 8.0 |
| Example 53 | $Gd_{2.8}Ca_{0.2}Fe_{4.3}Ge_{0.2}Al_{0.5}O_{12}$ | | 1550 | 99.9 | 5 | 18.0 |
| Example 54 | $Gd_{2.99}Ca_{0.01}Fe_{4.99}Ge_{0.01}O_{12}$ | 1400 | 1500 | 99.9 | 8 | 15.0 |
| Example 55 | $Gd_2Ca_1Fe_3Ge_1Al_1O_{12}$ | 1400 | 1500 | 99.9 | 8 | 15.0 |
| Example 56 | $Y_{2.5}Ca_{0.5}Fe_{4.5}Si_{0.5}O_{12}$ | 1400 | 1530 | 99.9 | 10 | 15.0 |
| Example 57 | $Y_{2.5}Ca_{0.5}Fe_4Si_{0.5}Ga_{0.5}O_{12}$ | 1400 | 1530 | 99.9 | 8 | 15.0 |
| Example 58 | $Tb_{2.5}Ca_{0.5}Fe_{4.5}Sn_{0.5}O_{12}$ | 1400 | 1500 | 99.9 | 8 | 15.0 |
| Example 59 | $Tb_{2.5}Ca_{0.5}Fe_4Sn_{0.5}In_{0.5}O_{12}$ | 1400 | 1500 | 99.9 | 5 | 15.0 |
| Example 60 | $Yb_{2.5}Ca_{0.5}Fe_{4.5}Zr_{0.5}O_{12}$ | 1400 | 1500 | 99.9 | 8 | 15.0 |
| Example 61 | $Yb_{2.5}Ca_{0.5}Fe_4Zr_{0.5}Sc_{0.5}O_{12}$ | 1400 | 1500 | 99.9 | 5 | 15.0 |
| Example 62 | $Y_{2.5}Ca_{0.5}Fe_{4.5}Ti_{0.5}O_{12}$ | 1430 | 1530 | 99.9 | 10 | 15.0 |
| Example 63 | $Y_{2.5}Ca_{0.5}Fe_4Ti_{0.5}Al_{0.5}O_{12}$ | 1430 | 1530 | 99.9 | 8 | 15.0 |
| Example 64 | $Gd_{2.5}Ca_{0.5}Fe_{4.75}Sb_{0.25}O_{12}$ | 1400 | 1500 | 99.9 | 8 | 15.0 |
| Example 65 | $Gd_{2.5}Ca_{0.5}Fe_{4.25}Sb_{0.25}Ga_{0.5}O_{12}$ | 1400 | 1500 | 99.9 | 5 | 15.0 |
| Example 66 | $Y_{2.5}Ca_{0.5}Fe_{4.75}V_{0.25}O_{12}$ | 1400 | 1500 | 99.9 | 10 | 15.0 |
| Example 67 | $Y_{2.5}Ca_{0.5}Fe_{4.25}V_{0.25}In_{0.5}O_{12}$ | 1400 | 1500 | 99.9 | 8 | 15.0 |

According to the process of this invention, it is possible to obtain very large single ferrite crystals of the garnet structure.

Figure 7:
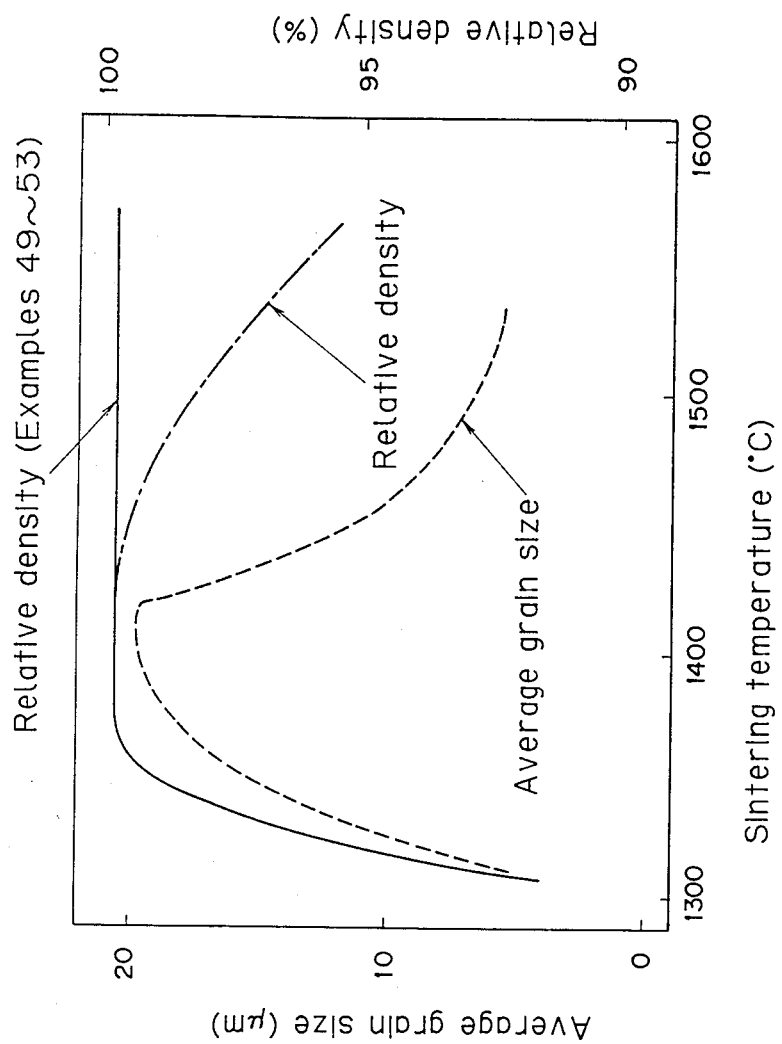
FIG. 7 shows the relative density of a sintered body having a composition of $Gd_{2.8}Ca_{0.2}Fe_{4.3}Ge_{0.2}Al_{0.5}O_{12}$ in Examples 49 to 53 as a function of the sintering temperature.

The ralative density of the garnet ferrite of $Gd_{2.8}Ca_{0.2}Fe_{4.3}Ge_{0.2}Al_{0.5}O_{12}$ obtained in Examples 49 to 53 is shown as a function of the sintering temperature in a solid line in FIG. 7.

Pellets having the same composition as in Example 49 were formed and the resultant pellets were sintered at varied temperatures. The average grain sizes and relative densities of the sintered bodies obtained at the different temperatures were measured. The average grain size and relative density are shown in a dotted line and a chain line, respectively, as a function of the sintering temperature (FIG. 7).

As apparent from FIG. 7, when the sintering temperature is within the range between 1350° C. and 1450° C. in which densification of the raw materials for the garnet ferrite proceeds, the relative density reaches a value of about 100% and the average grain size also increases. However, when the sintering temperature exceeded 1450° C., the average grain size of the sintered body started dropping, showing that only a small number of crystal grains are caused to grow to larger grains. The average grain size becomes constant when the sintering temperature exceeds 1550° C., indicating that the growth of crystal grains will not proceed any more.

Furthermore, it has been also found that, when raw materials for the garnet ferrite are kept in the temperature range between 1450° and 1550° C. in which grain growth is induced, without sintering within the temperature range in which densification proceeds and without seeding of a seed crystal, the relative density of the thus obtained sintered body drops slightly as the sintering temperature becomes higher.

Figure 8:
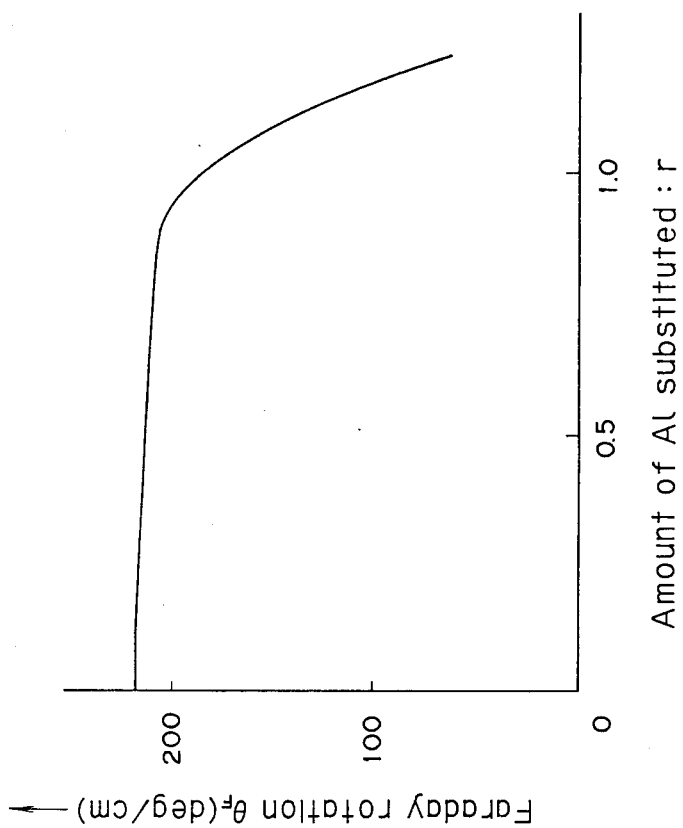
FIG. 8 shows Faraday rotation as a function of the amount r of the substituent Al in a single crystal having a composition of $Y_{2.98}Ca_{0.02}Fe_{4.98-r}Ge_{0.02}Al_rO_{12}$ in Example 68.

EXAMPLE 68:

Relationship between the degree of Faraday rotation and the amount of substituent Al in the garnet ferrite of Formula V in case where a single crystal is seeded By changing the amount r of the substituent Al, single crystals of the following formula:

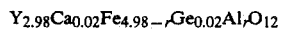

$$Y_{2.98}Ca_{0.02}Fe_{4.98-r}Ge_{0.02}Al_rO_{12}$$

were respectively caused to grow in the same manner as in Example 49:

The resultant single crystals were cut off from their corresponding sintered bodies. After applying optical polishing treatment to the single crystals, their Faraday rotations $\theta_F$ (deg/cm) were measured by a semiconductor laser having a wavelength of 1.3 μm. Measurement results are diagrammatically shown in FIG. 8. As is apparent from FIG. 8, $\theta_F$ began to drop disadvantageously when the amount of the substituent Al became greater than 1.0.

EXAMPLE 69

Preparation of garnet ferrites of Formula IV in case where a single crystal is seeded after the sintering in the densification temperature range is effected and then sintering in the grain growth temperature range is effected After the same powders as in Example 49 were prepared and molded, the resultant pellets were at first sintered for 8 hours at a temperature of 1400° C. Subsequently, the surfaces of the thus obtained sintered body and a single crystal of Gadolinium-Iron-Garnet (GdIG) having a size of $2\times2\times2$ mm$^3$ obtained by the flux method were subjected to mirror-surface-polishing and onto the polished surface of the GdIG single crystal to be seeded a hydrogen chloride solution was applied to bond it to the sintered body, then the resultant bonded body was sintered for another 8 hours at a temperature of 1500° C.

The thus obtained sintered body which is a finished product was observed to be a single crystal in which the whole sintered body comprises substantially one crystal grain.

EXAMPLES 70 TO 80

Preparation of garnet ferrite of Formulae VII and VIII

In order to obtain garnet-structured ferrites having a composition shown in Table 5, respectively, powdery, oxides of the respective site components were weighed. The oxides may be, for example, $Y_2O_3$, $Gd_2O_3$, $Tb_4O_7$, $Yb_2O_3$, $CaCO_3$, $FeOOH$, $GeO_2$, $SiO_2$, $V_2O_5$, $SnO_2$, $TiO_2$, $Sb_2O_3$, $ZrO_2$, $Al_2O_3$, $Ga_2O_3$, $In_2O_3$, $Sc_2O_3$, $La_2O_3$, $CeO_2$, $Pr_6O_{11}$ and $Nd_2O_3$. The respective powdery raw materials were formulated and mixed for 24 hours in a wet ball mill and then dried. Each of the thus-prepared mixed powder samples was granulated and the granulated powder sample was filled in an alumina crucible, in which it was calcined at 1100° C. for 4 hours in the atmosphere. The calcined body was again ground in a wet ball mill, followed by drying. Each of the thus-obtained powder samples had a composition given in Table 4, respectively.

To each of the powder samples a suitable amount of an aqueous solution of polyvinyl alcohol was added. The resultant mass samples were each press-molded under a pressure of 1 ton/cm$^2$, thereby obtaining pellets having a diameter of 20 mm and a thickness of 5 mm.

In the streaming of oxygen, the respective pellet samples were sintered for 8 hours within a temperature range indicated in Table 5, respectively. The densities of the thus-obtained sintered bodies were measured by the Archimedean principle to calculate their relative densities (%) based respectively on their theoretical densities. Furthermore, the surfaces of the sintered bodies were polished and were then subjected to etching. Thereafter, the average grain sizes of crystal grains constituting the sintered bodies other than the resultant largely grown single crystal grains, and the maximum crystal grain size of the resultant largely grown single crystal grains were measured. Results are collectively shown in Table 5.

TABLE 5

| | Composition | Sintering temperature (°C.) | Relative density (%) | Average grain size (μm) | Maximum grain size of single crystal (mm) |
|---|---|---|---|---|---|
| Example 70 | $Gd_{1.5}Pr_1Ca_{0.5}Fe_{4.0}Ge_{0.5}Al_{0.5}O_{12}$ | 1450 | 99.9 | 10 | 5.0 |
| Example 71 | $Gd_{1.5}Pr_1Ca_{0.5}Fe_{4.0}Ge_{0.5}Al_{0.5}O_{12}$ | 1500 | 99.9 | 8 | 8.0 |
| Example 72 | $Gd_{1.5}Pr_1Ca_{0.5}Fe_{4.0}Ge_{0.5}Al_{0.5}O_{12}$ | 1550 | 99.9 | 5 | 15.0 |
| Example 73 | $Gd_2Pr_{0.5}Ca_{0.5}Fe_{4.0}Ge_{0.5}Al_{0.5}O_{12}$ | 1500 | 99.9 | 7 | 15.0 |

TABLE 5-continued

|  | Composition | Sintering temperature (°C.) | Relative density (%) | Average grain size (μm) | Maximum grain size of single crystal (mm) |
|---|---|---|---|---|---|
| Example 74 | $Gd_1Pr_{1.5}Ca_{0.5}Fe_{4.0}Ge_{0.5}Al_{0.5}O_{12}$ | 1500 | 99.9 | 7 | 15.0 |
| Example 75 | $Y_1Nd_{1.5}Ca_{0.5}Fe_{4.0}Zr_{0.5}Ga_{0.5}O_{12}$ | 1500 | 99.8 | 5 | 15.0 |
| Example 76 | $Yb_2Ce_{0.2}Ca_{0.8}Fe_{4.0}Sn_{0.8}In_{0.2}O_{12}$ | 1500 | 99.9 | 7 | 15.0 |
| Example 77 | $Tb_2La_{0.2}Ca_{0.8}Fe_{3.5}Ti_{0.8}Sc_{0.7}O_{12}$ | 1500 | 99.9 | 7 | 15.0 |
| Example 78 | $Y_2Nd_{0.5}Ca_{0.5}Fe_{4.0}Si_{0.5}In_{0.5}O_{12}$ | 1500 | 99.8 | 7 | 15.0 |
| Example 79 | $Yb_2Pr_{0.4}Ca_{0.6}Fe_{4.0}V_{0.3}Ga_{0.7}O_{12}$ | 1500 | 99.9 | 5 | 15.0 |
| Example 80 | $Tb_2Pr_{0.6}Ca_{0.4}Fe_{4.0}Sb_{0.2}Al_{0.8}O_{12}$ | 1500 | 99.9 | 7 | 15.0 |

According to the process of this invention, it is possible to obtain very large single ferrite crystals of the garnet structure.

EXAMPLE 81

The average grain size and the relative density of the garnet ferrite of Formula VII as a function of the sintering temperature:

By choosing the kinds and relative proportions of raw material to give a composition of $Gd_{1.5}Pr_{1.0}Ca_{0.5}Fe_{4.0}Ge_{0.5}Al_{0.5}O_{12}$, pellets were formed in the same manner a n Example 70. The resultant pellets were sintered at varied temperatures. The average grain sizes and the relative densities of the sintered bodies obtained respectively at the different temperatures were measured. The average grain size and the relative density are plotted as a function of the sintering temperature (FIG. 9).

Figure 9:
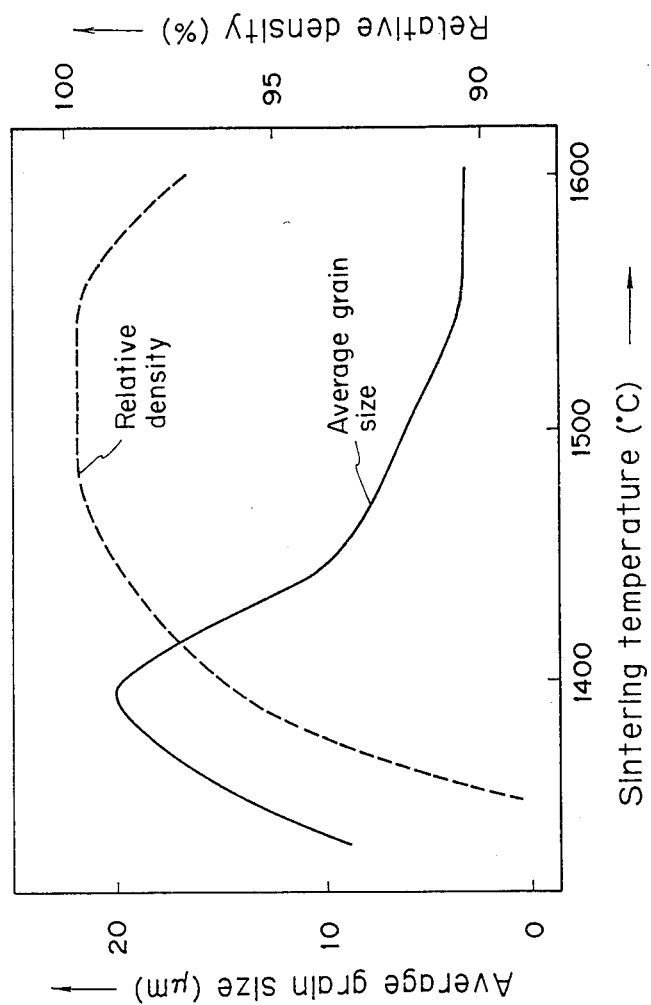
FIG. 9 shows the average grain size and the relative density of a sintered body having a composition of $Gd_{1.5}Pr_{1.0}Ca_{0.5}Fe_{4.0}Ge_{0.5}Al_{0.5}O_{12}$ in Example 81, in a solid line and a dotted line, respectively.

As apparent from FIG. 9, when the sintering temperature is 1450° C. or higher, the average grain size of the sintered body decreased abruptly and the growth of crystal grains proceeded markedly. However, when the sintering temperature exceeded 1550° C., the relative density of the sintered body started dropping.

EXAMPLE 82

Figure 10:
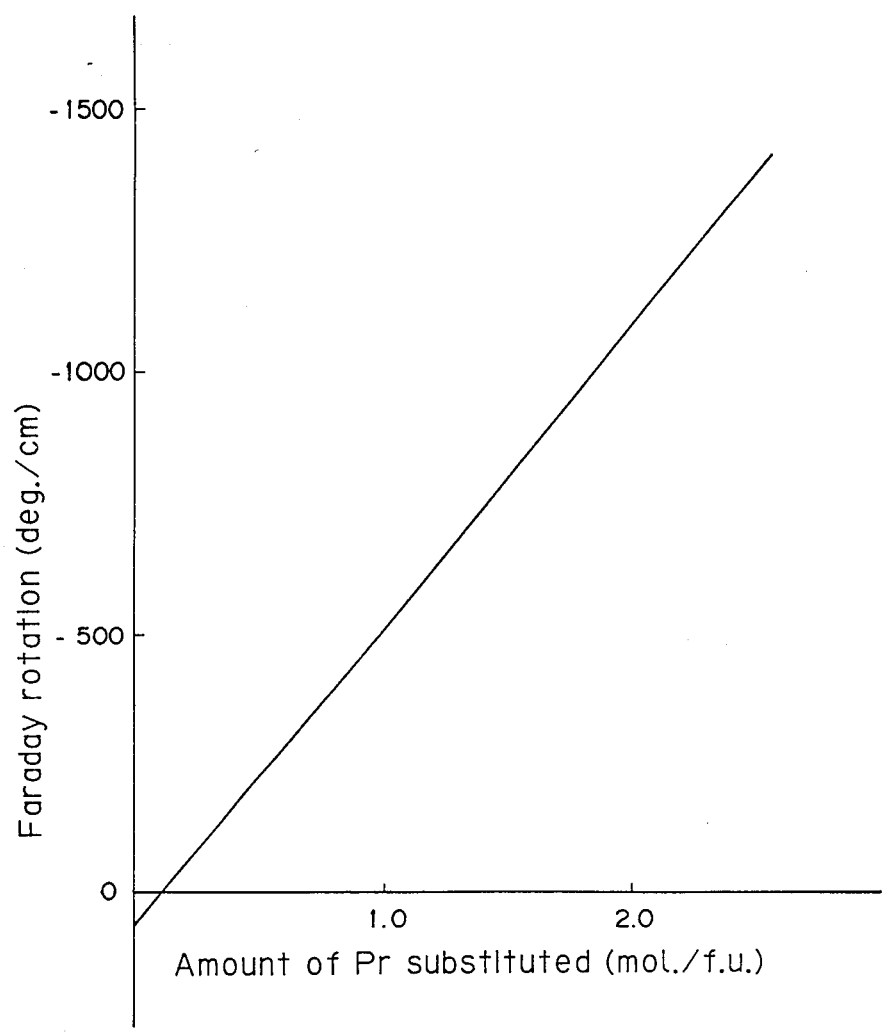
FIG. 10 shows Faraday rotation as a function of the amount b of the substituent Pr in a single crystal having a composition of $Gd_{2.5-b}Pr_bCa_{0.5}Fe_{4.0}Ge_{0.5}Al_{0.5}O_{12}$ in Example 82.

Relationship between the degree of Faraday rotation and the amount of substituent Pr in the garnet ferrite of Formula VII By changing the amount b of the substituent Pr, single crystals of the following formula:

$$Gd_{2.5-b}Pr_bCa_{0.5}Fe_{4.0}Ge_{0.5}Al_{0.5}O_{12}$$

were respectively caused to grow in the same manner as in Example 70:

The resultant single crystals were cut off from their corresponding sintered bodies. After applying optical polishing treatment to the single crystals, their Faraday rotations $\theta_F$ (deg/cm) were measured by a semiconductor laser having a wavelength of 1.3 μm. Measurement results are diagrammatically shown in FIG. 10. As is apparent from FIG. 10, $\theta_F$ (deg/cm) having an extremely large degree can be obtained when the amount of the substituent Pr became greater than 0.5.

As apparent from the descriptions above, the process of this invention permits the production of a single garnet ferrite crystal, which is free of mixed impurities and hence has nondeteriorated optical absorption characteristic, in a shorter period of growth time i.e., 24 hours at most as compared with the conventional method, without need for any noble metal crucible. Accordingly, it has brought about a significant contribution to the reduction of the production cost and its industrial value is very high. Furthermore, the single crystals produced in accordance with the process of this invention can be employed as microwave elements for microwave filters and the like.

The above and other objects, features and advantages of the present invention will become apparent from the following description and appended claims, taken in conjunction with the accompanying drawings.

We claim:

1. A process for producing a single crystal of garnet ferrite, consisting essentially of the step of subjecting raw materials for the garnet ferrite, said raw materials comprising an admixture of simple oxides, to sintering at a temperature between 1350° and 1550° C., such that unequal grain growth results in a conversion of said raw materials into a crystalline structure comprising a few grains which are much larger than surrounding grains, said crystalline structure having the formula:

$$Ca_xM_{3-x}N_5O_{12}$$

wherein (i) M is at least one of yttrium and a rare earth element, (ii) x satisfies the relationship:

$$0.01 \leq x \leq 1.0,$$

and (iii) N is a component comprised of iron, an a-site element and a d-site element, said a-site and d-site elements being present in amounts, respectively, such that electrical neutrality is maintained in said structure.

2. The process according to claim 1, wherein heating the admixture is carried out at a first temperature in which densification of said raw materials for the garnet ferrite proceeds before sintering at a second temperature between 1350° and 1550° C.

3. The process according to claim 1, wherein the raw materials for the garnet ferrite are additionally seeded by a single crystal having the same structure as that of a resultant single crystal of the garnet ferrite.

4. The process according to claim 2, wherein, before subjecting the raw materials for the garnet ferrite to heating at the first temperature, in which densification of the raw materials for the garnet ferrite proceeds, the raw materials for the garnet ferrite are seeded by a single crystal having the same structure as that of a resultant single crystal of the garnet ferrite.

5. The process according to claim 2, wherein, after subjecting the raw materials for the garnet ferrite to heating at the first temperature, in which densification of the raw materials for the garnet ferrite proceeds and before subjecting the raw materials for the garnet ferrite to said sintering at the second temperature, in which said unequal grain growth is induced, the densified garnet ferrite is seeded by a single crystal having the same structure as that of a resultant single crystal of the garnet ferrite.

6. The process according to claim 1, wherein M comprises at least one element selected from the group consisting of yttrium, gadolinium, terbium and ytterbium, and wherein the garnet ferrite has an a-site element or a d-site element that is selected from the group consisting of tin, zirconium, titanium, germanium, silicon, vanadium and antimony.

7. The process according to claim 1, wherein M comprises at least one element selected from the group consisting of yttrium, gadolinium, terbium and ytterbium, and wherein N comprises iron and at least one element selected from the group consisting of tin, zirconium, titanium, germanium, silicon, vanadium and antimony and at least one element selected from the group consisting of aluminum, gallium, indium and scandium.

8. The process according to claim 1, wherein M comprises at least one element selected from the group consisting of yttrium, gadolinium, terbium and ytterbium and at least one element selected from the group consisting of lanthanum, cerium, praseodymium and neodymium, and wherein N comprises iron and at least one element selected from the group consisting of tin, zirconium, titanium, germanium, silicon, vanadium and antimony and at least one element selected from the group consisting of aluminum, gallium, indium and scandium.

9. The process according to claim 2, wherein grain said second temperature is between 1450° and 1550° C.

10. The process according to claim 2, wherein said first temperature is between 1350° and 1450° C.

11. The process according to claim 6, wherein said raw materials are sintered within a temperature range between 1450° and 1550° C.

12. The process according to claim 7, wherein said raw materials are sintered within a temperature range between 1450° and 1550° C.

13. The process according to claim 8, wherein said raw materials are sintered within a temperature range between 1450° and 1550° C.

* * * * *